United States Patent [19]

Nguyen et al.

[11] Patent Number: 5,744,192
[45] Date of Patent: Apr. 28, 1998

[54] METHOD OF USING WATER VAPOR TO INCREASE THE CONDUCTIVITY OF COOPER DESPOSITED WITH CU(HFAC) TMVS

[75] Inventors: Tue Nguyen; Yoshihide Senzaki; Masato Kobayashi; Lawrence J. Charneski, all of Vancouver; Sheng Teng Hsu, Camas, all of Wash.

[73] Assignees: Sharp Microelectronics Technology, Inc., Camas, Wash.; Sharp Kabushiki Kaisha, Osaka, Japan

[21] Appl. No.: 745,562

[22] Filed: Nov. 8, 1996

[51] Int. Cl.[6] .............................. B05D 5/12; C23C 16/04; C23C 16/18
[52] U.S. Cl. ..................... 427/99; 427/250; 427/255.3
[58] Field of Search ...................... 427/99, 250, 255.3

[56] References Cited

U.S. PATENT DOCUMENTS

| 5,322,712 | 6/1994 | Norman et al. | |
|---|---|---|---|
| 5,358,743 | 10/1994 | Hampden-Smith et al. | 427/255.1 |
| 5,391,517 | 2/1995 | Gelatos et al. | 437/192 |
| 5,429,987 | 7/1995 | Allen | 437/192 |
| 5,441,766 | 8/1995 | Choi et al. | 427/314 |
| 5,527,739 | 6/1996 | Parrillo et al. | 437/192 |

OTHER PUBLICATIONS

Article Entitled Chemical Vapor Deposition of Copper from (hfac)CuL(L = LTMS and 2–Butyne) in the Presence of Water, Methanol, and Dimethyl Ether printed in Chem. Mater. 1996, vol. 8,No. 5, pp. 1119–1127 Jain, A et al.

Article entitled "Chemical Vapor Desposition of Copper from $CU^{+1}$ Precursors in the Presence of Water Vapor" published in the Appl. Phys. Letter 63 (20), Nov. 15, 1993, pp. 2842–2844 Gelatos, A.V., et al.

Article entitled "CHemical Addiives for Improved Copper CVD Processing Using (hfac) Cu(TMVS)" 1995 Material Research Society, Conference Proceedings ULSI–X, 1995, pp. 79–86 Hochberg, Arthur et al.

Primary Examiner—Shrive P. Beck
Assistant Examiner—Bret Chen
Attorney, Agent, or Firm—Gerald W. Maliszewski; David C. Ripma

[57] ABSTRACT

A method of blending water vapor with volatile Cu(hfac) TMVS (copper hexafluoroacetylacetonate trimethylvinylsilane) is provided which improves the deposition rate of Cu, without degrading the resistivity of the Cu deposited upon an integrated circuit surface. The method of the present invention uses a relatively small amount of water vapor, approximately 0.3 to 3% of the total pressure of the system in which chemical vapor deposition (CVD) Cu is applied. The method specifies the flow rates of the liquid precursor, carrier gas, and liquid water. The method also specifies the pressures of the vaporized precursor, vaporized precursor blend including carrier gas and water vapor. In addition, the temperatures of the vaporizers, chamber walls, and IC surfaces are disclosed. A Cu precursor blend is also provided comprising vaporized Cu(hfac)TMVS and water vapor. The ratio of water vapor pressure to vaporized precursor is approximately 0.5 to 5%. Further, an IC surface covered with Cu applied with a Cu precursor blend including vaporized Cu(hfac)TMVS and water vapor, with the above mentioned ratio of water vapor pressure to volatile Cu(hfac)TMVS pressure, is provided.

26 Claims, 4 Drawing Sheets

METHOD OF USING WATER VAPOR TO INCREASE THE CONDUCTIVITY OF COOPER DESPOSITED WITH CU(HFAC) TMVS

BACKGROUND OF THE INVENTION

This invention relates generally to integrated circuit processes and fabrication, and more particularly, to a copper precursor blend and method of reducing the resistivity of copper deposited on selected integrated circuit surfaces.

The demand for progressively smaller, less expensive, and more powerful electronic products, in turn, fuels the need for smaller geometry integrated circuits (ICs), and large substrates. It also creates a demand for a denser packaging of circuits onto IC substrates. The desire for smaller geometry IC circuits requires that the interconnections between components and dielectric layers be as small as possible. Therefore, research continues into reducing the width of via interconnects and connecting lines. The conductivity of the interconnects is reduced as the surface area of the interconnect is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conductors having highly different impedance characteristics.

There is a need for interconnects and vias to have both low resistivity, and the ability to withstand volatile process environments. Aluminum and tungsten metals are often used in the production of integrated circuits for making interconnections or vias between electrically active areas. These metals are popular because they are easy to use in a production environment, unlike copper which requires special handling.

Copper (Cu) is a natural choice to replace aluminum in the effort to reduce the size of lines and vias in an electrical circuit. The conductivity of copper is approximately twice that of aluminum and over three times that of tungsten. As a result, the same current can be carried through a copper line having nearly half the width of an aluminum line.

The electromigration characteristics of copper are also much superior to those of aluminum. Aluminum is approximately ten times more susceptible than copper to degradation and breakage due to electromigration. As a result, a copper line, even one having a much smaller cross-section than an aluminum line, is better able to maintain electrical integrity.

There have been problems associated with the use of copper, however, in IC processing. Copper pollutes many of the materials used in IC processes and, therefore, care must be taken to keep copper from migrating. Elements of copper migrating into these semiconductor regions can dramatically alter the conduction characteristics of associated transistors. Another problem with the use of copper is the relatively high temperature needed to deposit it on, or removing it from, an IC surface. These high temperatures can damage associated IC structures and photoresist masks.

It is also a problem to deposit copper onto a substrate, or in a via hole, using the conventional processes for the deposition of aluminum when the geometries of the selected IC features are small. That is, new deposition processes have been developed for use with copper, instead of aluminum, in the lines and interconnects of an IC interlevel dielectric. It is impractical to sputter metal, either aluminum or copper, to fill small diameter vias, since the gap filling capability is poor. To deposit copper, first, a physical vapor deposition (PVD), and then, a chemical vapor deposition (CVD) technique, have been developed by the industry.

With the PVD technique, an IC surface is exposed to a copper vapor, and copper is caused to condense on the surfaces. The technique is not selective with regard to surfaces. When copper is to be deposited on a metallic surface, adjoining non-conductive surfaces must either be masked or etched clean in a subsequent process step. As mentioned earlier, photoresist masks and some other adjoining IC structures are potentially damaged at the high temperatures at which copper is processed. The CVD technique is an improvement over PVD because it is more selective as to which surfaces copper is deposited on. The CVD technique is selective because it relies on a chemical reaction between the metallic surface and the copper vapor to cause the deposition of copper on the metallic surface.

In a typical CVD process, copper is combined with a ligand, or organic compound, to help make the copper volatile. That is, copper becomes an element in a compound that is vaporized into a gas. Selected surfaces of an integrated circuit, such as diffusion barrier material, are exposed to the copper gas, or precursor, in an elevated temperature environment. When the copper gas compound decomposes, copper is left behind on the selected surface. Several copper gas compounds are available for use with the CVD process. It is generally accepted that the configuration of the copper gas compound, at least partially, affects the ability of the copper to be deposited on to the selected surface.

$Cu^{+2}(hfac)_2$, or copper (II) hexafluoroacetylacetonate, precursors have previously been used to apply CVD copper to IC substrates and surfaces. However, these $Cu^{+2}$ precursors are notable for leaving contaminates in the deposited copper, and for the relatively high temperatures that must be used to decompose the precursor into copper. Currently, more success has been found with the use of $Cu^{+1}$ (hfac) compounds to apply copper. Norman, et al., U.S. Pat. No. 5,322,712, discloses a Cu(hfac)TMVS, or copper hexafluoroacetylacetonate trimethylvinylsilane, precursor that is the industry standard at the time of this writing. Alternately, TMVS is known as VTMS, or vinyltrimethylsilane. This precursor is useful because it can be used at relatively low temperatures, approximately 200° C. In addition, the film resisitivity of copper applied with this method is very good, approaching the physical limit of 1.7 $\mu\Omega$-cm. However, the adhesiveness between copper deposited with this precursor and the surface to which it is deposited is not always good. Also, the precursor is not especially stable, and can have a relatively short shelf life if not refrigerated.

Various ingredients have been added to Cu(hfac)TMVS to improve its adhesiveness, temperature stability, and the rate at which it can be deposited on an IC surface. In Gelatos, et al., "Chemical vapor deposition of copper from $Cu^{+1}$ precursors in the presence of water vapor", Appl. Phys. Lett., 63(20), pp. 2842–2844, Nov. 15, 1993, the authors disclose a method of adding water vapor to Cu(hfac)TMVS. The addition of water vapor improved the deposition rate of copper, but significantly degraded the resistivity of the deposited copper.

In Hochberg, et al., "Chemical Additives For Improved Copper CVD Processing Using (HFAC)CU(TMVS)", Advanced Metallization for ULSI Applications in 1994, pp. 79–86, 1994, the authors disclose a method of adding water to a Cu(hfac)TMVS precursor in the form of hexafluoroacetone dihydrate (Hhfac·2H$_2$O). The stability of the precursor is improved as well as the deposition rate, but the conductivity of the deposited copper is not improved. In addition, the copper films formed are rough in texture.

Jain, et al., in "Chemical Vapor Deposition of Copper from (hfac)CuL (L=VMTS and 2-Butyne) in the Presence of Water, Methanol and Dimethyl Ether", Chem. Mater, 8, pp. 1119-1127, 1996, disclose a method of adding water vapor to Cu(hfac)TMVS. Once again, the deposition rate of the copper precursor is improved, however, the resistivity of the deposited copper is poor.

It would be advantageous if a method were found of making Cu(hfac)TMVS more stable over a wider range of temperatures, and to provide the precursor with a longer shelf life.

It would be advantageous if a method were found for making Cu(hfac)TMVS such that the copper deposition rate is increased when the precursor is applied to an IC copper-receiving surface.

It would also be advantageous if a method were found for taking advantage of the properties of a water additive which increase the deposition rate of the Cu(hfac)TMVS precursor, without increasing the resistivity of the copper, deposited by this method.

It would be advantageous if a specific amount of water could be added to Cu(hfac)TMVS to improve the deposition rate, without degrading the copper film resisitivity or the resistance between deposited copper and the surface upon which the copper is deposited.

SUMMARY OF THE INVENTION

Accordingly, a method is provided for applying chemical vapor deposition (CVD) copper (Cu) on selected integrated circuit (IC) surfaces, the copper-receiving surfaces being on selected regions of the IC and the IC being located inside a walled environmental chamber having a chamber pressure. The method comprises the steps of: exposing each selected copper-receiving surface to a volatile Cu(hfac)TMVS precursor introduced into the chamber and contributing to the chamber pressure; simultaneously exposing each selected copper-receiving surface to water vapor introduced into the chamber at a pressure generally in the range between 0.3 and 3% of the chamber pressure; and, while continuing to carry out the above steps, depositing copper on each copper-receiving surface in response to the above steps, whereby the addition of water to the precursor, in the amount described above, increases the deposition rate of the copper, and electrical conductivity across the deposited copper.

In one embodiment of the invention, the Cu(hfac)TMVS precursor is a Cu(hfac)TMVS precursor blend additionally including less than approximately 5% TMVS, as measured by weigh ratio, to increase the stability and shelf life of the precursor. Another embodiment provides a Cu(hfac)TMVS precursor blend additionally including less than approximately 0.4% Hhfac, as measured by weight ratio, to increase the deposition rate of the precursor.

A volatile copper precursor blend for applying copper to selected surfaces of an IC is also provided. The precursor blend is comprised of a volatile Cu(hfac)TMVS precursor having a precursor vapor pressure, and water vapor having a water vapor pressure. The water vapor is blended with the volatile Cu(hfac)TMVS so that the pressure of the water vapor is generally in the range of 0.5 to 5% of the Cu(hfac)TMWS precursor vapor pressure, whereby the addition of water vapor to Cu(hfac)TMVS increases the rate of copper deposition and the electrical conductivity of the deposited copper.

An adherent copper conductor interface on an integrated circuit is also provided comprising a selected copper-receiving surface on the integrated circuit, and a copper layer overlying the copper-receiving surface. The copper layer is deposited on the copper-receiving surface by a copper precursor blend through the exposure of the copper-receiving surface to volatile Cu(hfac)TMVS simultaneously with water vapor in an environmental chamber, with the pressure of the water vapor being generally in the range between 0.5 and 5% of the precursor pressure. The deposition rate of the copper layer on the copper-receiving surface, and the electrical conductivity across the copper-receiving surface, are increased by the addition of water, in the above specified quantities, to the Cu(hfac)TMVS.

DETAILED DESCRIPTION OF THE PREFERRED EMBODIMENT

Figure 1:
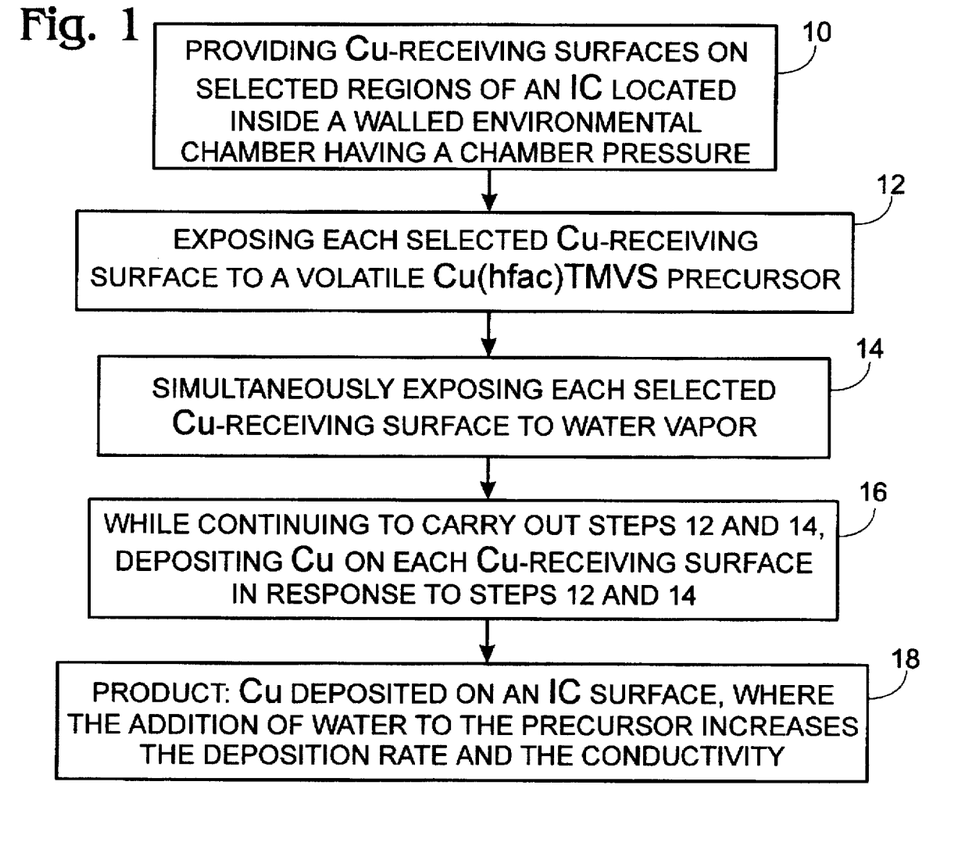
FIG. 1 is a flow chart illustrating steps in the method for applying chemical vapor deposition copper on selected integrated circuit surfaces.

FIG. 1 is a flow chart illustrating steps in the method for applying chemical vapor deposition (CVD) copper (Cu) on selected integrated circuit (IC) surfaces. Step 10 provides copper-receiving surfaces on selected regions of the IC. The IC is located inside a walled environmental chamber having a chamber pressure. Step 12 exposes each selected copper-receiving surface to a volatile Cu(hfac)TMVS precursor introduced into the chamber and contributing to the chamber pressure. Step 14, simultaneously with Step 12, exposes each selected copper-receiving surface to water vapor introduced into the chamber at a pressure generally in the range between 0.3 and 3% of the chamber pressure. Step 16, while continuing to carry out Steps 12 and 14, deposits copper on each copper-receiving surface in response to Steps 12 and 14. Step 18 is a product, which is copper deposited on an IC surface where the addition of water to the precursor, in the amount described in Step 14, increases the deposition rate of the copper, and electrical conductivity across the deposited copper.

The inclusion of additives in Cu(hfac)TMVS to improve certain characteristics of the copper precursor is not new. Even the addition of water, water vapor, or Hhfac dihydrate is not new. In the three articles, mentioned above in the Background section, water is used as an agent to enhance the deposition rate, adhesiveness, and stability of the Cu(hfac)TMVS precursor. In all three cases, however, the resistivity of copper, applied with a water additive in the precursor, increases. The present method differs from the above-mentioned results in using significantly smaller proportions of water vapor to copper precursor. By using smaller quantities of water vapor, the present invention is able to realize resistivities approaching the 1.7 μΩ-cm physical limit for copper.

Figure 2A:
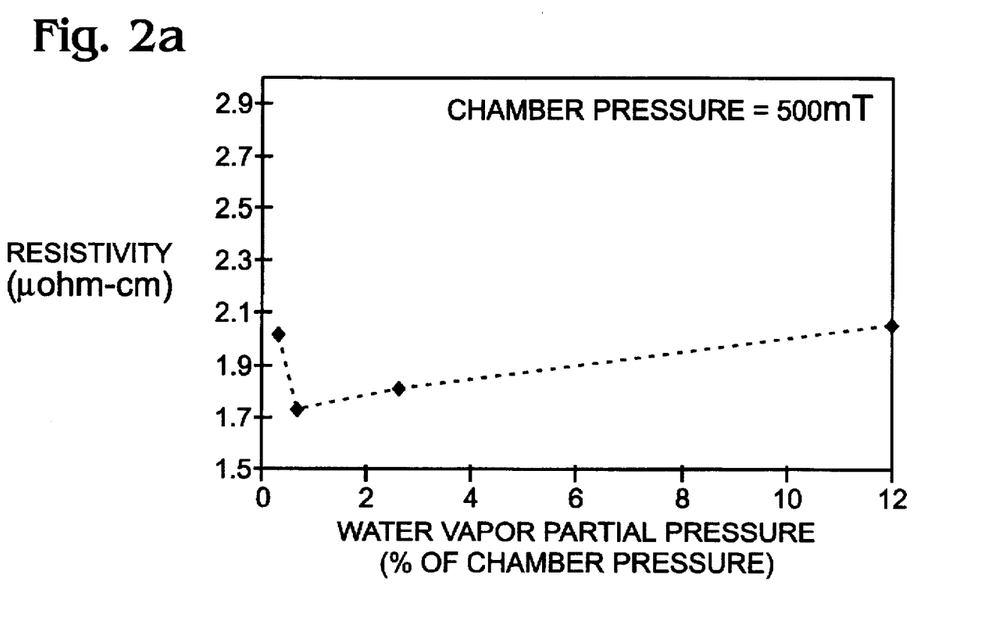
FIG. 2a is a graph illustrating the relationship between the resistivity of copper deposited on an IC surface and water vapor pressure.

FIG. 2a is a graph illustrating the relationship between the resistivity of copper deposited on an IC surface and water vapor pressure. The vertical axis displays resisitivity and the horizontal axis displays water vapor as a partial pressure relative to the chamber pressure. The partial pressure is the ratio of water vapor pressure to total chamber pressure, and is expressed as a percentage. Throughout the measurements the chamber pressure is held constant at 500 milliTorr (mT).

The water vapor pressure varies from 0 to 12%, while the resistivity of the deposited copper varies from approximately 2.1 to 1.7 μΩ-cm. Note that a minimum resistance value of approximately 1.7 μΩ-cm occurs at approximately 0.5%. Since the chamber pressure is 500 mT, the actual water vapor pressure at 0.5% is 2.5 mT (0.005×500=2.5).

Prior art measurements of the resistivity of copper taken with the addition of water to the Cu(hfac)TMVS precursor either failed to accurately note the low resistivity of copper at low water pressure levels, or failed to measure resistivity at low water pressure levels.

Figure 2B:
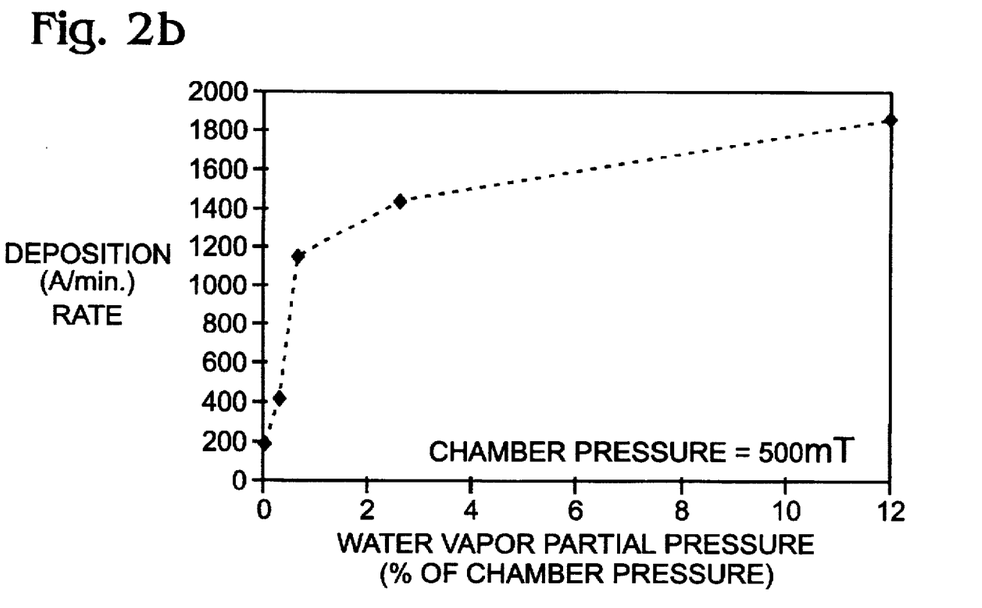
FIG. 2b is a graph illustrating the relationship between the deposition rate of copper and the water vapor pressure.

FIG. 2b is a graph illustrating the relationship between the deposition rate of copper and the water vapor pressure. The vertical axis depicts the deposition rate expressed in Å per minute, and the horizontal axis depicts the ratio of water vapor pressure to chamber pressure expressed as a percentage. Again, the chamber pressure is held constant at 500 mT. The graph shows the relatively poor deposition rate of pure Cu(hfac)TMVS at 0% water vapor pressure, approximately 200 Å/min. It can be seen that the deposition rate is highest at large water pressures, which may explain the failure of the prior art to fully explore the region of lower water vapor pressures in searching for means of increasing copper deposition rates. The present invention discloses a partial pressure between 0.3 and 3% partial pressure, a region in which the deposition rate varies from approximately 1200 to 1500 Å/min. While this deposition rate is not as good as achieved at with higher water pressures, its slightly lower deposition rates are offset by the advantages of improved conductivity as depicted in FIG. 2a.

The same advantage of low resistivity is maintained when other additives, besides water, are mixed with the blend of vaporized Cu(hfac)TMVS and water vapor. For example, additional TMVS is added to increase the stability of the Cu(hfac)TMVS and water blend. Then, the Cu(hfac)TMVS precursor is a Cu(hfac)TMVS precursor blend additionally including less than approximately 5% TMVS, as measured by weigh ratio, to increase the stability and shelf life of the precursor. Alternately, Hhfac is added to increase the deposition rate of the precursor blend. Then, the Cu(hfac)TMVS precursor is a Cu(hfac)TMVS precursor blend additionally including less than approximately 0.4% Hhfac, as measured by weight ratio. In addition, both Hhfac and TMVS are additives, in the quantities specified above, to the Cu(hfac) TMVS precursor to form a precursor blend having an increased deposition rate and increased temperature stability.

Although typically applied to conductive surfaces, the copper-receiving surfaces upon which the Cu(hfac)TMVS precursor blend is used, are both conductive and non-conductive. When the copper-receiving surface, upon which copper is deposited in Step 16, is conductive, it is selected from the group consisting of Cu, Ti, W, Al, TiN, TiON, TiSiN, TaN, TiW, TiWN, Mo, WN, TaSiN, and WSiN. When the copper-receiving surface, upon which copper is deposited in Step 16, is non-conductive, it is selected from the group consisting of BN, $Si_3N_4$, SiBN, TEOS oxide, SiN, fluoridated silicon oxide, silicon oxide, and polymers.

Figure 3:
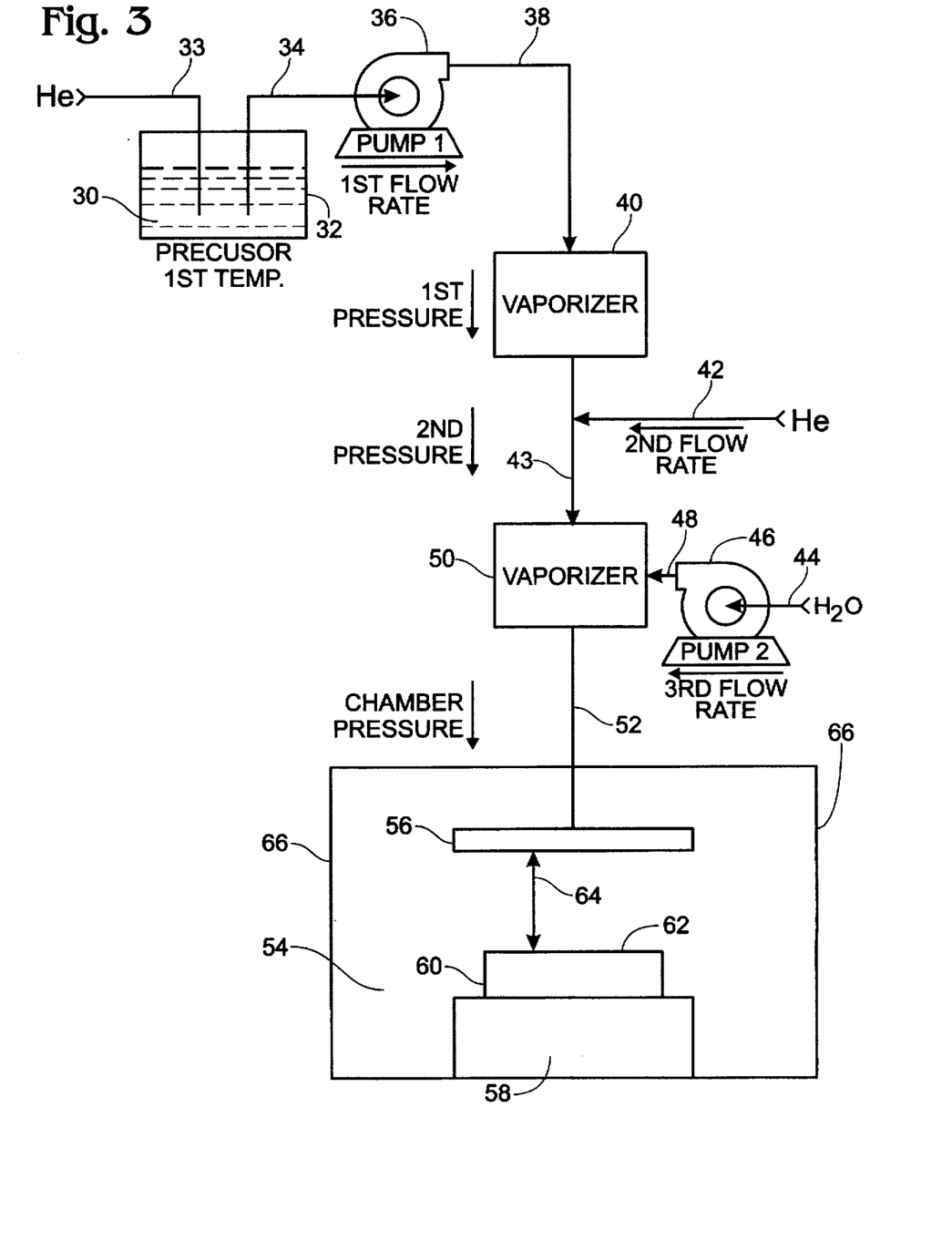
FIG. 3 illustrates steps in the method of forming a completed volatile copper precursor blend for applying copper to selected surfaces of an IC.

FIG. 3 illustrates steps in the method of forming a completed volatile copper precursor blend for applying copper to selected surfaces of an IC. The Cu(hfac)TMVS precursor begins the process in its pure form as a liquid 30. Liquid precursor 30 is stored in a container 32 and kept at a first temperature. An inert gas, such as helium (He), is introduced to liquid precursor 30 in a line 32. Liquid precursor 30 exits container 32 in a line 34 and passes through pump 36 into a line 38. Between the introduction of the inert gas in line 32 and pump 36, a first flow rate for liquid precursor 30 is established in line 38 which can be expressed in units of standard cubic centimeters (sccm).

Liquid precursor 30 enters a precursor vaporizer 40 where the precursor is vaporized. The vaporized, or volatile, precursor is still pure Cu(hfac)TMVS and now has a first pressure which can be represented in units of Torr (T) or milliTorr(mT). An inert gas, such as helium, is introduced to the vaporized precursor. The inert gas has a second flow rate in a line 42. After being mixed with the vaporized precursor, the precursor/inert gas mixture has a second pressure in a line 43.

Liquid water enters the system in a line 44, goes through a second pump 46 and enters a line 48. The liquid water has a third flow rate which can be expressed in sccm. The liquid water enters a vaporizer 50 where it becomes water vapor and is mixed with the combination of inert gas and vaporized precursor represented by the second pressure in line 43. The water vapor has a third pressure which mixes with the second pressure in a line 52 to become a chamber pressure. As mentioned earlier, the ratio of the water pressure to the chamber pressure is called a partial pressure. The partial pressure of the water vapor needed to perform the present invention can be expressed as the ratio of the water vapor pressure to the total chamber pressure. In other variations of the system, the water vapor can be added into the system in line 38 or 43. The inert gas in line 42 is, alternately, added into the system in line 38, instead of line 43.

Alternately, a partial pressure can be expressed as a ratio of water vapor pressure to vaporized precursor pressure. A volatile copper precursor blend for applying copper to selected surfaces of an IC is, therefore, described as a volatile Cu(hfac)TMVS precursor having a precursor vapor pressure, or first pressure, that contributes to the chamber pressure on line 52. The precursor blend also comprises water vapor having a water vapor pressure, or third pressure, blended with volatile Cu(hfac)TMVS in line 52 so that the pressure of the water vapor is generally in the range of 0.5 to 5% of the precursor pressure. The addition of water vapor to Cu(hfac)TMVS increases the rate of copper deposition and the electrical conductivity of the deposited copper.

The precursor blend of vaporized Cu(hfac)TMVS, inert gas, and water vapor is introduced into an environmental chamber 54. Specifically, the copper precursor blend is distributed in chamber 54 by a showerhead 56. Also located in chamber 54 is a wafer chuck 58, and mounted upon chuck 58 is an IC 60 having a copper-receiving surface 62. The spacing between showerhead 56 and copper-receiving surface 62 is represented by reference designator 64. In addition, chamber 54 has walls 66.

Besides the vaporized copper precursor and water vapor, the copper precursor blend in line 52 additionally comprises an inert carrier gas having a pressure in line 42 which is generally in the range between 50 and 100% of the Cu(hfac) TMVS precursor vapor pressure (first pressure) through vaporizer 40. The carrier gas from line 42 aids in controlling the rate at which the copper precursor blend in line 52 interacts with copper-receiving surface 62.

Figure 4:
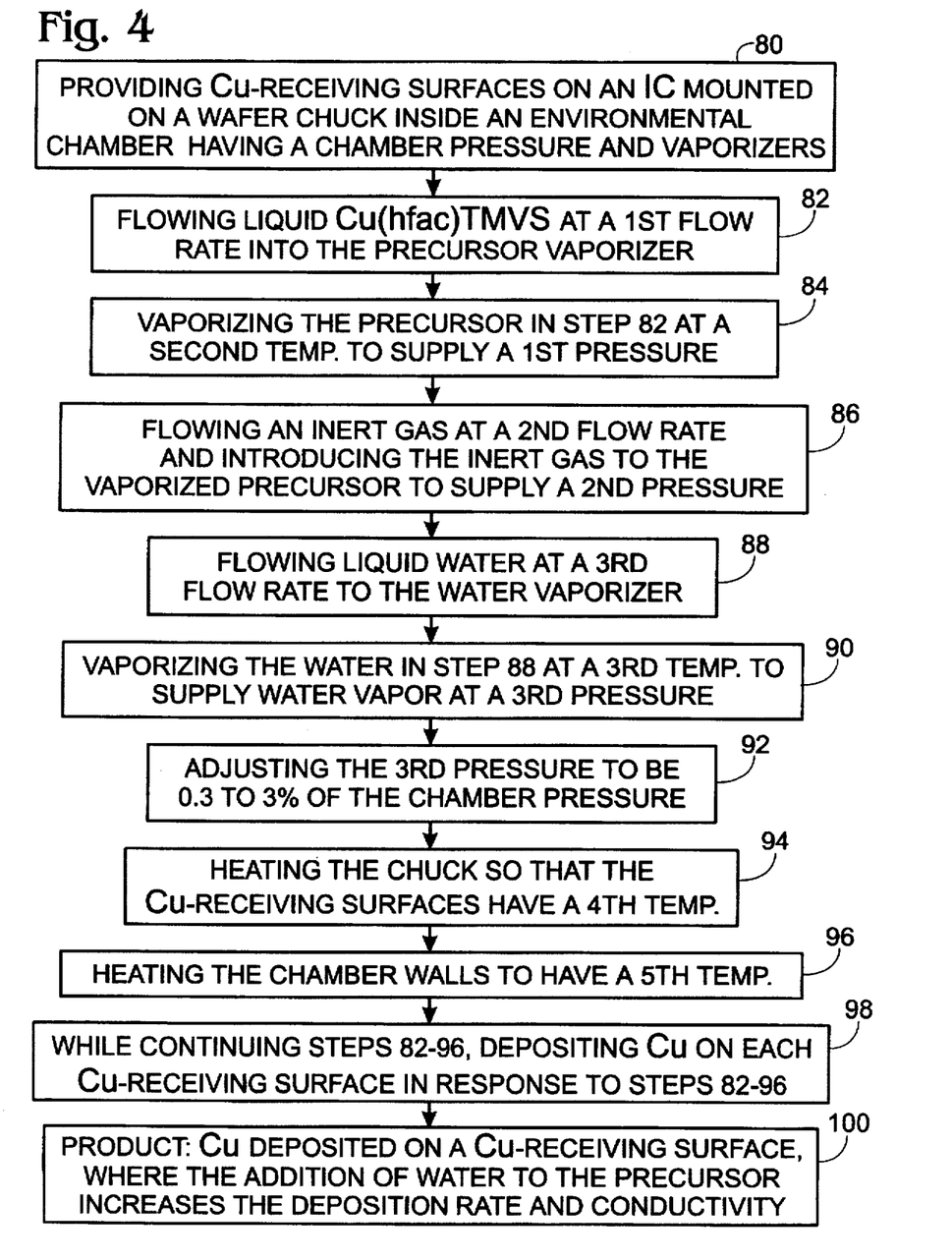
FIG. 4 is a more detailed description of the flow chart of FIG. 1 illustrating steps in the method for applying CVD copper on selected IC surfaces.

FIG. 4 is a more detailed depiction of the flow chart of FIG. 1 illustrating steps in the method for applying CVD copper on selected IC surfaces. The flow chart illustrated in FIG. 4 is best understood in conjunction with the precursor blending apparatus depicted in FIG. 3. Step 80 provides copper-receiving surfaces 62 on selected regions of IC 60. IC 60 is mounted on wafer chuck 58 inside walled environmental chamber 54 which has a chamber pressure in line 52. Chamber 54 also includes vaporizers 40 and 50 to vaporize liquids into gases and showerhead 56 to introduce gases to IC 60 mounted on wafer chuck 58. Step 82 flows liquid Cu(hfac)TMVS copper precursor 30 having a first temperature and a first flow rate in line 38 into precursor vaporizer 40. Step 84 vaporizes liquid precursor 30 in step 82 in precursor vaporizer 40 at a second temperature to supply a volatile precursor at a first pressure to contribute to the chamber pressure in line 52.

Step 86 flows an inert gas in line 42 at a second flow rate and introduces the inert gas to the vaporized precursor in line 43 to supply a second pressure which is the combination of the pressures of the volatile precursor and the inert gas. The second pressure is substantially equal to the chamber pressure in line 52. The inert gas acts as a carrier, aiding in the flow of volatile precursor into chamber 54.

Step 88 flows liquid water in line 44 at a third flow rate to water vaporizer 50. Step 90 vaporizes the water in step 88 in water vaporizer 50 at a third temperature to supply water vapor to chamber 54 at a third pressure to contribute to the chamber pressure on line 52. Step 92 adjusts the third pressure so that the third pressure generally contributes 0.3 to 3% of the chamber pressure. Steps 88 and 90, as well as FIG. 3, describe a liquid pump vaporizer system for the delivery of water. A bubbler system, vapor pulling system, and liquid flow control vaporizer system are alternate means of delivering water, as is well known in the art.

Step 94 heats chuck 58, upon which copper-receiving surface 62 is mounted, so that each copper-receiving surface 62 has a fourth temperature. Step 96 heats chamber walls 66 so that they have a fifth temperature. Step 98, while continuing steps 82 through 98, deposits copper on each copper-receiving surface 62 in response to steps 82 through 98. Step 100 is a product, copper deposited on each copper-receiving surface where the addition of water to the copper precursor increases the deposition rate of the copper and the conductivity across the deposited copper.

The first flow rate in line 38 is generally in the range between 0.8 and 20 sccm. The first pressure, or vaporized precursor pressure, is generally in the range between 250 and 1600 mT.

The second flow rate, or flow rate of the inert gas to be combined with the vaporized precursor, is generally in the range between 50 and 2000 sccm. The second pressure, or combined pressures of the vaporized precursor and inert gas, is generally in the range between 500 and 2000 mT. The second flow rate is substantially the same as the chamber pressure. Therefore, the chamber pressure is generally in the range between 500 and 2000 mT.

The third flow rate, or flow rate of liquid water in line 44, is generally in the range between 1 and 10 sccm. The third pressure, or pressure of the water vapor, is generally in the range between 2.5 and 60 mT.

The first temperature, or temperature of liquid precursor 30, is generally in the range between 15° and 40° C. The second temperature (at which the precursor is vaporized), third temperature (at which the water is vaporized), and fifth temperature (of chamber walls 66), are generally in the range between 40° and 80° C. The fourth temperature, or the temperature of each copper-receiving surface 62 upon which copper is deposited, is generally in the range between 160° and 250° C.

Spacing 64 between showerhead 56 and IC surface 62 mounted on wafer chuck 58 is generally in the range between 10 and 20 mm.

Figure 5:
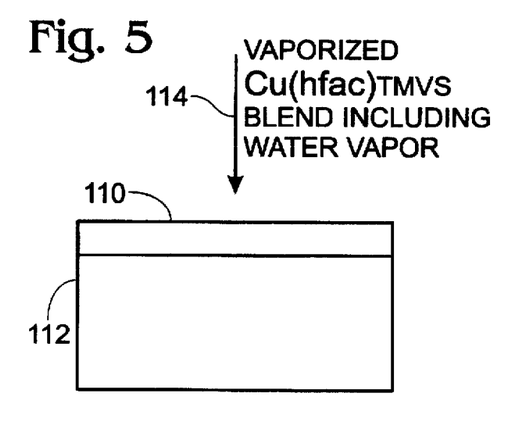
FIGS. 5 and 6 illustrate steps in the formation of a completed adherent copper conductor interface on an integrated circuit formed by exposure of the copper-receiving surface to a copper precursor blend consisting of Cu(hfac)TMVS and water vapor.
Figure 6:
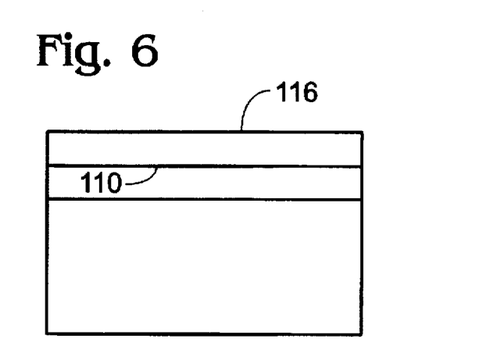

FIGS. 5 and 6 illustrate steps in the formation of a completed adherent copper conductor interface on an integrated circuit formed by exposure of the copper-receiving surface to a copper precursor blend consisting of Cu(hfac) TMVS and water vapor. FIG. 5 illustrates a copper-receiving surface 110 on an integrated circuit 112. Copper-receiving surface 110 is exposed to a copper precursor blend. The precursor blend exposes copper-receiving surface 110 to volatile Cu(hfac)TMVS simultaneously with water vapor in an environmental chamber (not shown). The precursor blend is represented by reference designator 114. The pressure of the water vapor is generally in the range between 0.5 and 5% of the precursor pressure. FIG. 6 illustrates a copper layer 116 overlying copper-receiving surface 110. Copper layer 116 is deposited on copper-receiving surface 110 by copper precursor blend 114. The deposition rate of copper layer 116 on copper-receiving surface 110, and the electrical conductivity across copper layer 116, are increased by the addition of water, in the above specified quantities, to the Cu(hfac) TMVS.

The use of Cu(hfac)TMVS to apply copper to selected surfaces of IC's is well known. Generally, the resistivity of copper applied with pure Cu(hfac)TMVS is good and approaches the physical limit of copper resistivity at 1.7 $\mu\Omega$-cm. However, pure Cu(hfac)TMVS is not stable. It can only be stored at room temperature for a matter of hours before the precursor potentially begins to degrade. Also, the deposition rates of copper applied with pure Cu(hfac)TMVS are not good enough to support production processes.

The inclusion of additives in Cu(hfac)TMVS to improve certain characteristics of the copper precursor is not new. Even the addition of water, water vapor, or Hhfac dihydrate is not new. The addition of water to Cu(hfac)TMVS is well known as an agent to improve the deposition rate of the precursor. In the article entitled, "Chemical vapor deposition of copper from $Cu^{+1}$ precursors in the presence of water vapor", Gelatos, et al., pg. 2843, disclose resistivity against relatively large water vapor pressures, up to 1 Torr (T). Further, the authors state, "The resistivity remains independent of water vapor at low concentrations ($P_{water}$ less than 0.4 Torr) and is equal to 2.3±0.1 $\mu\Omega$-cm." In the article entitled, "Chemical Additives For Improved Copper CVD Processing Using (HFAC)CU(TMVS), Hochberg, et al., disclose, on page 83, the use of a relatively high percentage of water vapor compared to Cu(hfac)TMVS. The authors describe measuring approximately a 2 $\mu\Omega$-cm resistivity but no plot of the results is offered. Jain, et al., in "Chemical Vapor Deposition of Copper from (hfac)CuL (L=VMTS and 2-Butyne) in the Presence of Water, Methanol, and Dimethyl Ether", also disclose water vapor at a relatively high flow rate compared to the flow rate of the precursor, and resistivities above 2 $\rho\Omega$-cm.

Water has, therefore, from prior art studies, been shown to improve adhesion and deposition rate, but at the cost of resistivity. The present invention specifies a specific amount of water which does not degrade resistivity. The present method differs from the above-mentioned results in using significantly smaller proportions of water vapor to copper precursor. By using smaller quantities of water vapor, the present invention is able to realize resistivities approaching the 1.7 µΩ-cm physical limit for copper.

Alternate embodiments of the invention allow liquid water is be added to Cu(hfac)TMVS in its liquid form to create a blend that offers the same conductivity advantages as blending the same components in vapor form. In another embodiment, water is added to Cu(hfac)TMVS in its liquid form as Hhfac·2H$_2$O. Other embodiments of the invention will occur to those skilled in the art.

What is claimed is:

1. A method for applying chemical vapor deposition (CVD) copper (Cu) on selected copper-receiving surfaces in an integrated circuit (IC), the copper-receiving surfaces being located inside a chamber having chamber walls and a total chamber pressure which includes a volatile Cu(hfac) TMVS (copper hexafluoroacetylacetonate trimethylvinylsilane) precursor pressure and a water vapor pressure, wherein the partial pressure of water vapor in the chamber is the ratio of the water vapor pressure to the total chamber pressure, the method comprising the steps of:

a) supplying volatile Cu(hfac)TMVS precursor to the chamber;
   b) supplying the water vapor to the chamber, and controlling the supply of water vapor so that the water vapor partial pressure is in the range of 0.3 to 3%;
   c) exposing each selected copper-receiving surface to the volatile Cu(hfac)TMVS precursor;
   d) simultaneously exposing each selected cooper-receiving surface to the water vapor;
   e) depositing Cu on each cooper-receiving surface in response to steps a) through d), whereby the addition of water vapor to the Cu(hfac)TMVS precursor, in the amount described in step b), increases the electrical conductivity across the Cu deposited in step e).

2. A method as in claim 1 in which the Cu(hfac)TMVS precursor is a Cu(hfac)TMVS precursor blend including less than approximately 5% TMVS, as measured by weight ratio, to increase the stability and shelf life of the Cu(hfac)TMVS precursor blend.

3. A method as in claim 1 wherein step e) includes heating each copper-receiving surface to a temperature in the range between 160° C. and 250° C.

4. A method as in claim 1 in which the chamber walls have a temperature within the range between 40° C. and 80° C.

5. A method as in claim 1 wherein liquid Cu(hfac)TMVS is provided and in which step a) includes volatilizing the liquid Cu(hfac)TMVS at a temperature in the range between 40° C. and 80° C.

6. A method as in claim 1 wherein liquid water is provided and in which step b) includes volatilizing the liquid water at a temperature in the range between 40° C. and 80° C.

7. A method as in claim 1 wherein the copper-receiving surface is conductive and selected from the group consisting of Cu, Ti, W, Al, TiN, TiON, TiSiN, TaN, TiW, TiWN, Mo, WN, TaSiN, and WSiN.

8. A method as in claim 1 wherein the copper-receiving surface is non-conductive and selected from the group consisting of BN, Si$_3$N$_4$, SiBN, TEOS oxide, SiN, fluorinated silicon oxide, and silicon oxide.

9. A method as in claim 1 in which the total chamber pressure is in the range between 500 and 2000 mT.

10. A method as in claim 1 in which the Cu(hfac)TMVS precursor is a Cu(hfac)TMVS precursor blend including less than approximately 0.4% Hhfac, as measured by weight ratio, to increase the deposition rate of the Cu(hfac)TMVS precursor blend.

11. A method as in claim 1 in which step b) includes controlling the water vapor supply so that the water vapor partial pressure is approximately 0.5%.

12. A method for applying CVD Cu on selected copper-receiving surface in an IC, the copper-receiving surfaces being mounted on a wafer chuck inside a walled chamber having a total chamber pressure which includes second and third pressures, wherein precursor and water vaporizers are included to vaporize liquids into gases and a showerhead having a predetermined spacing from the copper-receiving surface to introduce gases to the copper-receiving surface mounted on the wafer chuck, the method comprising the steps of:

a) flowing liquid Cu(hfac)TMVS precursor having a first temperature and a first flow rate into the precursor vaporizer;
   b) vaporizing the liquid Cu(hfac)TMVS precursor, in the precursor vaporizer, the precursor vaporizer having a second temperature;
   c) supplying a volatile Cu(hfac)TMVS precursor having a first pressure from the Cu(hfac)TMVS precursor vaporized in step b);
   d) flowing an inert gas having a second flow rate and mixing the inert gas with the volatile Cu(hfac)TMVS precursor, the combination of the first pressure and the inert gas having a second pressure substantially equal to the total chamber pressure, whereby the inert gas acts as a carrier gas, aiding in the flow of volatile Cu(hfac) TMVS precursor into the chamber;
   e) flowing liquid water having a third flow rate to the water vaporizer;
   f) vaporizing the water in the water vaporizer, the water vaporizer having a third temperature;
   g) supplying water vapor having a third pressure to the chamber from the water vaporized in step f);
   h) controlling the water vapor supply so that the ratio of the third pressure to the total chamber pressure is in the range of 0.3 to 3%;
   i) heating the wafer chuck, upon which the copper-receiving surface is mounted, so that each copper-receiving surface has a fourth temperature;
   j) heating the chamber walls so that they have a fifth temperature; and
   k) depositing Cu on each copper-receiving surface in response to steps a) through j), whereby the addition of water vapor to the Cu(hfac)TMVS Cu precursor increases the conductivity of the Cu deposited in step k).

13. A method as in claim 12 in which the Cu(hfac)TMVS precursor in step a) is a Cu(hfac)TMVS precursor blend including less than approximately 5% TMVS, as measured by weight ratio, to improve the stability and shelf life of the Cu(hfac)TMVS precursor blend.

14. A method as in claim 12 wherein step a) includes the first flow rate being in the range between 0.8 and 20 sccm.

15. A method as in claim 14 in which step c) includes the first pressure being in the range between 250 and 1600 mT.

16. A method as in claim 15 in which step d) includes the second flow rate being in the range between 50 and 2000 sccm.

17. A method as in claim 16 in which step d) includes the second pressure being in the range between 500 and 2000 mT.

18. A method as in claim 17 in which step e) includes the third flow rate being in the range between 1 and 10 sccm.

19. A method as in claim 18 in which step h) includes controlling the water vapor supply so that the third pressure in the range between 2.5 and 60 mT.

20. A method as in claim 19 in which step a) includes the first temperature being in the range between 15° and 40° C.

21. A method as in claim 20 in which steps b), f), and j) respectively include the second, third, and fifth temperatures being in the range between 40° and 80° C.

22. A method as in claim 21 in which step i) includes the fourth temperature being in the range between 160° and 250° C.

23. A method as in claim 22 in which the spacing between the showerhead and the copper-receiving surface is in the range between 10 and 20 mm.

24. A method as in claim 12 in which the Cu(hfac)TMVS precursor is a Cu(hfac)TMVS precursor blend including less than approximately 0.4% Hhfac, as measured by weight ratio, to increase the deposition rate of the Cu(hfac)TMVS precursor blend.

25. A method as in claim 12 in which step h) includes controlling the water vapor supply so that the ratio of the third pressure to total chamber pressure is approximately 0.5%.

26. A method for applying chemical vapor deposition (CVD) copper (Cu) on selected copper-receiving surfaces in an integrated circuit (IC), the method comprising the steps of:

a) supplying a liquid Cu(hfac)TMVS (copper hexafluoroacetylacetonate trimethylvinylsilane) precursor;

b) vaporizing the liquid Cu(hfac)TMVS to provide a pure volatile Cu(hfac)TMVS precursor having a Cu(hfac)TMVS precursor pressure;

c) supplying water vapor having a water vapor pressure so that the water vapor pressure is in the range of 0.5 to 5% of the Cu(hfac)TMVS pressure;

d) exposing each selected copper-receiving surface to the volatile Cu(hfac)TMVS precursor;

e) exposing each selected copper-receiving surface to the water vapor; and f) depositing Cu on each copper-receiving surface in response to steps a) through e), whereby the addition of water vapor to the volatile Cu(hfac)TMVS precursor, in the pressure ratio described in step c), increases the electrical conductivity.

\* \* \* \* \*

UNITED STATES PATENT AND TRADEMARK OFFICE
CERTIFICATE OF CORRECTION

PATENT NO. : 5,744,192
DATED : April 28, 1998
INVENTOR(S) : Tue Nguyen, Yoshihide Senzaki, Masato Kobayashi, Lawrence J. Charneski and Sheng Teng Hsu It is certified that error appears in the above-indentified patent and that said Letters Patent is hereby corrected as shown below:

Title Page, Title, Line 3

Column 1, line 3

"COOPER DESPOSITED" should be
— COPPER DEPOSITED —

Title Page,
 Right Column, Line 5

"CHemical Addiives" should be
— Chemical Additives —.

Signed and Sealed this

Fourth Day of August, 1998

Attest:

BRUCE LEHMAN

Attesting Officer

Commissioner of Patents and Trademarks